United States Patent
Matejka et al.

(10) Patent No.: US 10,068,325 B2
(45) Date of Patent: Sep. 4, 2018

(54) METHOD FOR THREE-DIMENSIONALLY MEASURING A 3D AERIAL IMAGE OF A LITHOGRAPHY MASK

(71) Applicant: Carl Zeiss SMT GmbH, Oberkochen (DE)

(72) Inventors: Ulrich Matejka, Jena (DE); Christoph Husemann, Jena (DE); Johannes Ruoff, Aalen (DE); Sascha Perlitz, Jena (DE); Hans-Jürgen Mann, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/410,918

(22) Filed: Jan. 20, 2017

(65) Prior Publication Data
US 2017/0132782 A1 May 11, 2017

Related U.S. Application Data

(63) Continuation of application No. PCT/EP2015/066605, filed on Jul. 21, 2015.

(30) Foreign Application Priority Data

Jul. 22, 2014 (DE) .................. 10 2014 214 257
Aug. 28, 2014 (DE) .................. 10 2014 217 229

(51) Int. Cl.
*G06K 9/00* (2006.01)
*G06T 7/00* (2017.01)
(Continued)

(52) U.S. Cl.
CPC ........ *G06T 7/0004* (2013.01); *G02B 27/0927* (2013.01); *G02B 27/0988* (2013.01);
(Continued)

(58) Field of Classification Search
CPC ... G03F 1/84; G03F 7/70666; G02B 27/0988; G02B 27/2292; G06T 2200/04;
(Continued)

(56) References Cited

U.S. PATENT DOCUMENTS

| | | | |
|---|---|---|---|
| 7,379,175 B1 * | 5/2008 | Stokowski ....... | G01N 21/95607 356/237.5 |
| 7,703,069 B1 * | 4/2010 | Liu ........................ | G03F 1/144 716/50 |

(Continued)

FOREIGN PATENT DOCUMENTS

| | | | |
|---|---|---|---|
| DE | 102 20 815 | 11/2003 | ............... G12K 7/00 |
| DE | 102 20 816 | 11/2003 | ............... G21K 7/00 |

(Continued)

OTHER PUBLICATIONS

German Examination Report for German Application No. DE 10 2014 214 257.1 dated Mar. 27, 2015.

(Continued)

*Primary Examiner* — Li Liu
(74) *Attorney, Agent, or Firm* — Fish & Richardson P.C.

(57) ABSTRACT

In a method for three-dimensionally measuring a 3D aerial image in the region around an image plane during the imaging of a lithography mask, which is arranged in an object plane, a selectable imaging scale ratio in mutually perpendicular directions (x, y) is taken into account. For this purpose, an electromagnetic wavefront of imaging light is reconstructed after interaction thereof with the lithography mask. An influencing variable that corresponds to the imaging scale ratio is included. Finally, the 3D aerial image measured with the inclusion of the influencing variable is output. This results in a measuring method with which (Continued)

lithography masks that are optimized for being used with an anamorphic projection optical unit during projection exposure can also be measured.

20 Claims, 10 Drawing Sheets

(51) Int. Cl.
G06T 7/60 (2017.01)
G06T 7/11 (2017.01)
G06T 3/40 (2006.01)
G06T 3/00 (2006.01)
G06T 11/60 (2006.01)
G02B 27/22 (2018.01)
G02B 27/09 (2006.01)
G03F 1/84 (2012.01)

(52) U.S. Cl.
CPC .......... *G02B 27/2292* (2013.01); *G03F 1/84* (2013.01); *G06T 3/0093* (2013.01); *G06T 3/40* (2013.01); *G06T 7/11* (2017.01); *G06T 7/60* (2013.01); *G06T 11/60* (2013.01); *G06T 2200/04* (2013.01); *G06T 2207/10032* (2013.01); *G06T 2207/20048* (2013.01); *G06T 2207/20076* (2013.01); *G06T 2207/30148* (2013.01)

(58) Field of Classification Search
CPC . G06T 2207/20048; G06T 2207/30148; G06T 3/40; G06T 7/0004; G06T 7/60
See application file for complete search history.

(56) References Cited

U.S. PATENT DOCUMENTS

| 2007/0058269 | A1 | 3/2007 | Maim et al. | |
|---|---|---|---|---|
| 2008/0036986 | A1 | 2/2008 | Yamaguchi | |
| 2009/0217233 | A1* | 8/2009 | Mimotogi | G03F 1/36 716/55 |
| 2010/0112465 | A1* | 5/2010 | Feldmann | G03F 7/70341 430/5 |
| 2013/0019212 | A1* | 1/2013 | Seidel | G03F 1/42 716/52 |
| 2013/0063716 | A1 | 3/2013 | Mann et al. | |
| 2013/0083321 | A1 | 4/2013 | Wack et al. | |
| 2015/0234289 | A1* | 8/2015 | Ruoff | G03F 7/70058 355/67 |
| 2016/0259248 | A1 | 9/2016 | Mann | |

FOREIGN PATENT DOCUMENTS

| DE | 10 2007 009 661 | 3/2008 | ............ G02S 27/50 |
|---|---|---|---|
| DE | 10 2008 019 341 | 10/2009 | ............ G01M 11/00 |
| DE | 10 2010 040 811 | 3/2012 | ............ G02B 17/06 |
| EP | 2 506 061 | 10/2012 | ............ G02B 17/08 |
| JP | 2011-108974 | 6/2011 | ............ H01L 21/027 |
| KR | 2013-0019384 | 2/2013 | ............ G03F 7/20 |
| WO | WO 2008/025433 | 3/2008 | |
| WO | WO 2011/120821 | 10/2011 | ............ G03F 7/20 |

OTHER PUBLICATIONS

International Search Report for International Application No. PCT/EP2015/066605 dated Nov. 5, 2015.
Dudley et al., "All-digital wavefront sensing for structured light beams", *Optics Express*, vol. 22, No. 11, pp. 14031-14040 (Jun. 2, 2014).
Fienup, "Phase retrieval algorithms: a comparison". Applied Optics vol. 21, No. 15, pp. 2758-2769 (Aug. 1982).
Hellweg et al., "AIMS™ EUV—the actinic aerial image review platform for EUV masks", *Proc. of SPIE*, vol. 7969, pp. 7969OH-1-7969OH-10 (2011).
Perlitz et al., "Concept and Feasibility of Aerial imaging Measurements on EUV Masks", *Proc. of SPIE*, vol. 7985, pp. 7985OU-1-9785OU-7 (2011).
Shanker et al., "Critical assessment of the transport of intensity equation as a phase recovery technique in optical lithography",*Proc. SPIE 9052, Optical Microlithography XXVII*, Mar. 31, 2014).
Van den Broek et al., "General framework for quantitative three-dimensional reconstruction from arbitrary detection geometries in TEM", *Physical Review B.*, vol. 87, No. 18 (May 2013).
Wang et al., "Spatial light interference microscopy (SLIM)", *Optics Express*, vol. 19, No. 2 (Jan. 17, 2011).
Wen et al., "Subnanoradian X-ray phase-contrast imaging using a far-field interferometer of nanometric phase gratings", *Nature Communications*, vol. 4 (Nov. 2013).
Zheng et al., "Wide-field, high-resolution Fourier ptychographic microscopy", *Nature Photonics*, vol. 7, No. 9, pp. 739-745 (Jul. 2013).
Zernike Polynomials, *Code V 10.4 Reference Manual*, pp. C-1-C16 (Sep. 2011).
South Korean Office Action for South Korean Application No. 10-2017-7004990 dated Dec. 13, 2017.

* cited by examiner

METHOD FOR THREE-DIMENSIONALLY MEASURING A 3D AERIAL IMAGE OF A LITHOGRAPHY MASK

CROSS REFERENCE TO RELATED APPLICATIONS

This application is a continuation of International Application PCT/EP2015/066605, having a filing date of Jul. 21, 2015, which claims priority to German patent application 10 2014 214 257.1, filed on Jul. 22, 2014, and German patent application 10 2014 217 229.2, filed on Aug. 28, 2014. The entire contents of the above applications are hereby incorporated by reference.

TECHNICAL FIELD

The invention relates to a method for three-dimensionally measuring a 3D aerial image in the region around an image plane during the imaging of a lithography mask. The invention also relates to a metrology system for carrying out this method.

BACKGROUND

Metrology systems of the type mentioned at the beginning are known from US 2013/0063716 A1, DE 102 20 815 A1, DE 102 20 816 A1 and US 2013/0083321 A1. EP 2 506 061 A1 discloses a projection optical unit for a projection exposure apparatus for producing semiconductor devices that uses an aperture stop in which the diameter of the stop in two mutually perpendicular directions differs by more than 10%. DE 10 2010 040 811 A1 describes an anamorphic projection optical unit. US 2008/0036986 A1 describes a projection exposure apparatus.

SUMMARY

In a general aspect, the present invention provides a method for measuring a 3D aerial image of a lithography mask in such a way that lithography masks that are optimized for being used with an anamorphic projection optical unit during projection exposure can also be measured.

In another general aspect, the invention is directed to a method for three-dimensionally measuring a 3D aerial image in the region around an image plane during the imaging of a lithography mask, which is arranged in an object plane, while taking into account a selectable imaging scale ratio in mutually perpendicular directions (x, y) with the following steps: reconstruction of an electromagnetic wavefront of imaging light after interaction thereof with the lithography mask, inclusion of an influencing variable that corresponds to the imaging scale ratio, and output of the 3D aerial image measured with the inclusion of the influencing variable.

According to the invention, it has been realized that, for measuring lithography masks that are optimized for use with anamorphic lithographic projection optical units, it is not absolutely necessary to use a metrology system with a likewise anamorphic projection optical unit. The method according to the invention can also be used with a projection optical unit that is not anamorphic and, in particular, does not have a selectable imaging scale ratio in mutually perpendicular directions. The anamorphic influence of the lithographic projection optical unit is emulated during measurement by including the influencing variable that is a measure of the imaging scale ratio of the lithographic projection optical unit to be emulated. It is included by manipulating the reconstructed electromagnetic wavefront, which can be performed by digital means. Existing metrology systems with non-anamorphic projection optical units, the image processing software of which is correspondingly converted, can in this way also be used in principle for the measurement of lithography masks that are optimized for use with anamorphic lithographic projection optical units.

Implementations can include one or more of the following features. The reconstruction of the electromagnetic wavefront can include carrying out the following steps: measuring a 2D imaging-light intensity distribution in the region of a plane (e.g., 14a) corresponding to the image plane (e.g., 24), displacing the lithography mask (e.g., 5) perpendicularly (z) to the object plane (e.g., 4) by a predetermined displacement ($\Delta z$; $\Delta z_1$, $\Delta z_2$; $\Delta z_1$, $\Delta z_2$, $\Delta zi$), and repeating (e.g., 30) the "measuring" and "displacing" steps until a sufficient number of 2D imaging-light intensity distributions to reproduce a 3D aerial image are measured. An increment of the displacement may be varied as appropriate for the respective measuring task. Measurement results between two actually measured displacement positions may also be obtained by interpolation. An interpolation may take place in the Fourier domain, but also in the spatial domain.

The measurement can be carried out with a measuring optical unit, the imaging scale of which is the same in mutually perpendicular directions (x, y), the inclusion of the influencing variable being performed by converting the data of the measured 2D imaging-light intensity distribution. The advantages of measurement with the measuring optical unit have already been discussed above.

A phase reconstruction can be performed in the reconstruction (e.g., 33) of the electromagnetic wavefront, which can allow a particularly exact reconstruction of the electromagnetic wavefront. A number of different digital methods, which are known from the literature, exist for carrying out such a phase reconstruction. The phase reconstruction may be performed by using a Fourier transformation and an inverse Fourier transformation.

A defocusing of the imaging of the lithography mask can be varied for the phase reconstruction, which can be brought about with already known metrology systems by displacing the lithography mask perpendicularly to the object plane, in each case by a predetermined displacement distance.

In the reconstruction (e.g., 33), a manipulation can be performed on the illumination optical unit (e.g., 7), with which the lithography mask (e.g., 5) is illuminated. The manipulation of the illumination optical unit is a variant that is alternatively or additionally possible and can be used for the reconstruction of the electromagnetic wavefront. For this reconstruction it is possible for the lithography mask to be illuminated from a plurality of different, exactly predetermined illumination directions and resultant 2D imaging-light intensity distributions for each of the illumination directions to be measured. A phase reconstruction may also be carried out with the aid of Fourier ptychography. This may involve for example moving a small-aperture pinhole stop through an illumination pupil of the metrology system, in order to bring about a diversification of the illumination directions that is required for Fourier ptychography.

For the reconstruction of the electromagnetic wavefront, an illumination pupil of the illumination optical unit (e.g., 7) can be varied. A variation of an illumination pupil of the illumination optical unit of the metrology system that is already known in principle from Spatial Light Interference Microscopy (SLIM) may also be used. A phase reconstruction of the electromagnetic wavefront may also be performed interferometrically, holographically or by using a coherent illumination of the lithography mask. As an alternative to coherent illumination, the respectively predetermined illumination setting within the illumination pupil may be used to perform a fine sampling, for which purpose in turn a pinhole stop may be used.

The inclusion (e.g., 31) of the influencing variable in the conversion of the data of the wavefront can be performed by a digital simulation of the imaging with the imaging scale ratio. The digital simulation of the imaging makes inclusion of the influencing variable that corresponds to the imaging scale ratio possible without requiring an intervention in the hardware. The digital simulation may be realized by simulating the effect of an oval object-side numerical aperture and realizing a round image-side numerical aperture during the imaging of the lithography mask. The digital simulation may be performed in the form of a digital cylindrical lens or in the form of the addition of an astigmatic wavefront.

Apart from a phase reconstruction, an intensity reconstruction may also be performed in the reconstruction (e.g., 33) of the electromagnetic wavefront. If an intensity reconstruction is performed, an imaging aperture stop with an x/y aspect ratio deviating significantly from 1 may be used. The reconstruction calculation in the intensity domain may likewise be performed with the aid of a Fourier transformation and an inverse transformation. An influencing variable that corresponds to the imaging scale ratio may in this case be included direction-dependently in terms of the direction of the Fourier component, in that measurement results with appropriate selection of a displacement increment are used. For each direction that is assigned a specific imaging scale ratio, a measurement result with its own displacement increment assigned to this direction can then be used.

The intensity reconstruction can be carried out with the following steps: measuring (e.g., 28) a 2D imaging-light intensity distribution in the region of a plane (e.g., 14a) corresponding to the image plane (e.g., 24), displacing the lithography mask (e.g., 5) perpendicularly (z) to the object plane (e.g., 4) by a predetermined displacement ($\Delta z$; $\Delta z_1$, $\Delta z_2$; $\Delta z_1$, $\Delta z_2$, $\Delta zi$), repeating (e.g., 30) the "measuring" and "displacing" steps until a sufficient number of 2D imaging-light intensity distributions to reproduce a 3D aerial image are measured; and carrying out an intensity Fourier transformation of the 2D imaging-light intensity distributions obtained (e.g., FIGS. 11 to 14) to generate a corresponding number of 2D intensity Fourier transforms. The generation of 2D intensity Fourier transforms has been found to be particularly suitable for intensity reconstruction.

The intensity reconstruction can be carried out with the following steps: measuring (e.g., 28) a 2D imaging-light intensity distribution in the region of a plane (14a) corresponding to the image plane (e.g., 24), displacing the lithography mask (e.g., 5) perpendicularly (z) to the object plane (e.g., 4) by a predetermined displacement ($\Delta z$; $\Delta z_1$, $\Delta z_2$; $\Delta z_1$, $\Delta z_2$, $\Delta zi$), repeating (e.g., 30) the "measuring" and "displacing" steps until a sufficient number of 2D imaging-light intensity distributions to reproduce a 3D aerial image are measured, and distorting the measured 2D imaging-light intensity distributions with the imaging scale ratio. Distorting the measured 2D imaging light intensity distributions allows the imaging behavior of a corresponding imaging optical unit to be emulated. After the distortion, an intensity Fourier transformation of the 2D imaging-light intensity distributions obtained may be performed to generate a corresponding number of 2D intensity Fourier transforms.

Items of information which are included in selected 2D intensity Fourier transforms that are measured with various displacements of the lithography mask or a test structure can be put together for the intensity reconstruction. The method for three-dimensionally measuring a 3D aerial image in the region around an image plane during the imaging of a lithography mask can include selecting the directional components of the generated 2D intensity Fourier transforms while taking into account the imaging scale ratio, a displacement ($\Delta zi$) during the displacing of the lithography mask (e.g., 5) perpendicularly to the object plane (e.g., 4) scaling with the alignment ($\varphi$) of the directional components, to generate in each case a partial synthetic 2D intensity Fourier transform; adding the generated partial synthetic 2D intensity Fourier transforms to form an overall synthetic 2D intensity Fourier transform; and carrying out an inverse intensity Fourier transformation of the overall synthetic 2D intensity Fourier transforms to produce a synthetic raw image. A set of 2D imaging-light intensity distributions that were measured for predetermined displacements of the lithography mask is used for this, and a directional component of the intensity Fourier transforms is respectively selected from this set with the aid of an assignment function. These various directional components are then put together. The assignment function is selected so as to ensure a transition that is as smooth as possible between those directional components that correspond to extreme values of the imaging scales. The assignment function is in particular monotonic and may be continuously differentiable, in particular multiply continuously differentiable.

A result image (e.g., FIG. 25) can be produced by distorting the synthetic raw image (e.g., FIG. 24) with the imaging scale ratio. The additional distortion step makes it possible in turn to emulate an imaging optical unit with a corresponding imaging scale ratio. As an alternative to a distortion of the synthetic raw image, a distortion may also be performed before carrying out an intensity Fourier transformation of measured 2D imaging-light intensity distributions. In this case, the measured 2D imaging-light intensity distributions are first distorted before the steps of intensity Fourier transformation, generation of an overall synthetic 2D intensity Fourier transform and intensity inverse Fourier transformation are performed.

The distortion may be performed digitally, therefore by conversion of the measured values.

The selection of the directional components of the generated 2D intensity Fourier transforms (e.g., FIGS. 15 to 18) can be performed by multiplying each of the generated 2D intensity Fourier transforms (e.g., FIGS. 15 to 18) by an assigned selection function (e.g., FIGS. 19 to 22) for the selection of predetermined angle sectors of the 2D intensity Fourier transforms (e.g., FIGS. 15 to 18), the selection function being dependent on the displacement ($\Delta zi$) perpendicularly to the object plane (e.g., 4) and on the imaging scale ratio, to generate the respective partial synthetic 2D Fourier transforms. The selection of the directional components of the generated 2D intensity Fourier transforms can be realized numerically with comparatively simple means. The selection function may be chosen so as to make allowance for a normalizing condition, which ensures that each direction is selected with equal entitlement.

The method for three-dimensionally measuring a 3D aerial image in the region around an image plane during the imaging of a lithography mask can include the use of a digital selection function, which can be numerically implemented in a particularly easy way. As an alternative to a digital selection function, which can only assume the values 0 and 1, a selection function with a continuous transition between the values 0 and 1 may be used.

In another general aspect of the invention, a metrology system (e.g., 2) for carrying out the method for three-dimensionally measuring a 3D aerial image in the region around an image plane during the imaging of a lithography mask can include an illumination optical unit (e.g., 7) for illuminating the lithography mask to be examined and an imaging optical unit (e.g., 13) for imaging the object towards a spatially resolving detection device (e.g., 14). The advantages of the metrology system correspond to those that have already been explained above with reference to the method according to the invention.

BRIEF DESCRIPTION OF DRAWINGS

An exemplary embodiment of the invention is explained in greater detail below with reference to the drawing. In said drawing.

DETAILED DESCRIPTION

Figure 1:
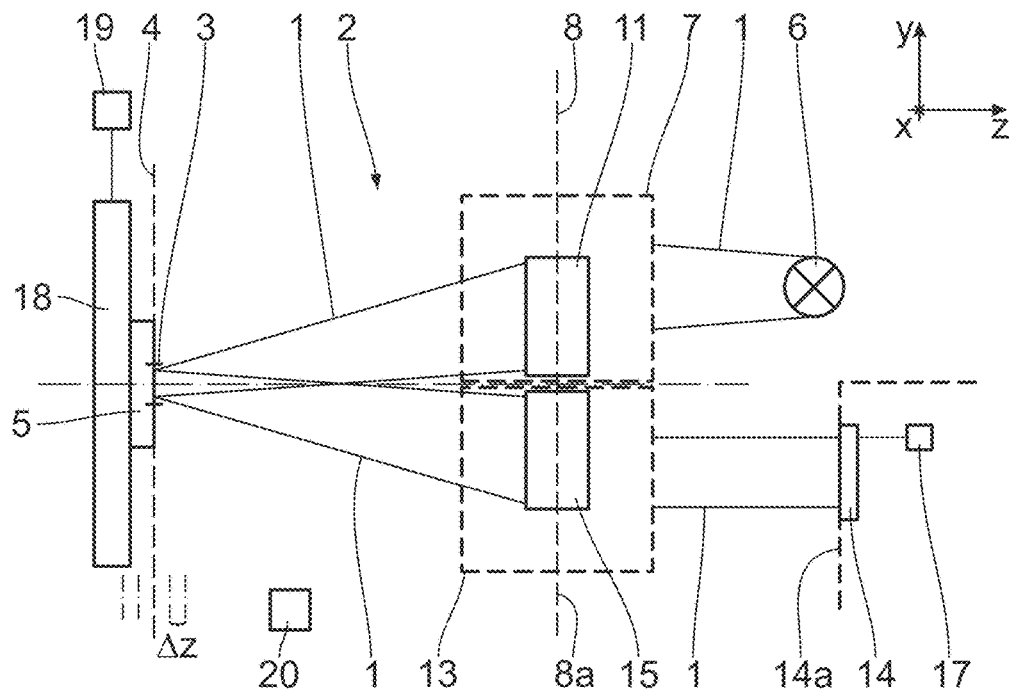
FIG. 1 shows highly schematically in a plan view looking in a direction perpendicular to a plane of incidence a metrology system for the examination of an object in the form of a lithography mask with EUV illumination and imaging light by use of an illumination optical unit and an imaging optical unit, each of which is represented extremely schematically.

A Cartesian xyz-coordinate system is used below to facilitate the illustration of positional relationships. In FIG. 1, the x axis runs perpendicularly to the plane of the drawing into the latter. In FIG. 1, the y axis runs upwards. In FIG. 1, the z axis runs towards the right.

FIG. 1 shows in a view corresponding to a meridional section a beam path of EUV illumination light and imaging light 1 in a metrology system 2 for the examination of an object 5, arranged in object field 3 in an object plane 4, in the form of a reticle or a lithography mask with the EUV illumination light 1. The metrology system 2 is used for analyzing a three-dimensional (3D) aerial image (Aerial Image Metrology System) and serves for simulating and analyzing the effects of properties of lithography masks, known as reticles, which in turn are used during projection exposure for producing semiconductor devices, on the optical imaging by projection optical units within a projection exposure apparatus. Such systems are known from US 2013/0063716 A1 (cf. FIG. 3 therein), from DE 102 20 815 A1 (cf. FIG. 9 therein) and from DE 102 20 816 A1 (cf. FIG. 2 therein) and from US 2013/0083321 A1.

The illumination light 1 is reflected at the object 5. The plane of incidence of the illumination light 1 lies parallel to the yz plane.

The EUV illumination light 1 is produced by an EUV light source 6. The light source 6 may be a laser plasma source (LPP; laser produced plasma) or a discharge source (DPP; discharge produced plasma). In principle, a synchrotron-based light source may also be used, for example a free electron laser (FEL). A used wavelength of the EUV light source may lie in the range between 5 nm and 30 nm. In principle, in the case of a variant of the metrology system 2, a light source for another used wavelength may also be used instead of the light source 6, for example a light source for a used wavelength of 193 nm.

Depending on the configuration of the metrology system 2, it may be used for a reflecting object 5 or for a transmitting object 5. An example of a transmitting object is a phase mask.

An illumination optical unit 7 of the metrology system 2 is arranged between the light source 6 and the object 5. The illumination optical unit 7 serves for the illumination of the object 5 to be examined with a defined illumination intensity distribution over the object field 3 and at the same time with a defined illumination angle distribution, with which the field points of the object field 3 are illuminated.

Figure 2:
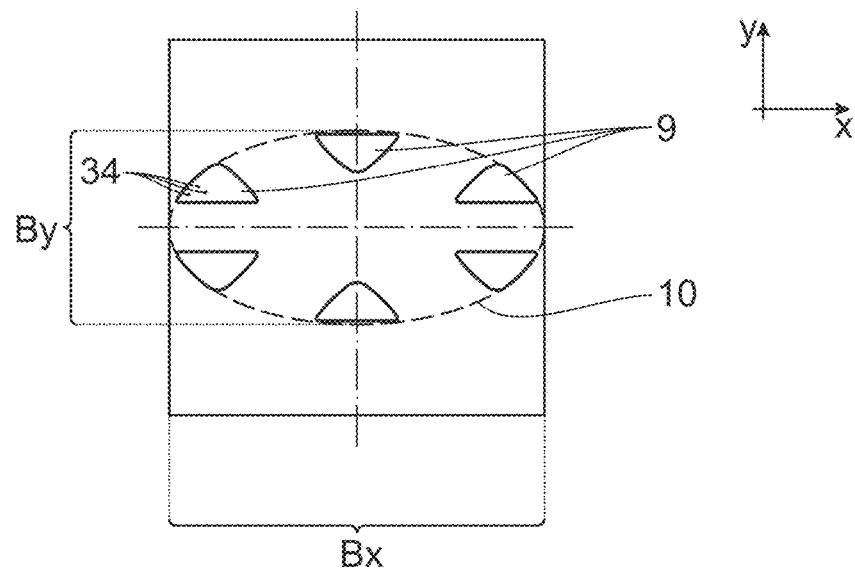
FIG. 2 shows an illumination setting, that is to say an intensity distribution of illumination light in a pupil plane of the illumination optical unit, for illumination of the object.

FIG. 2 shows a corresponding illumination setting, which can be set for the illumination optical unit 7. Represented in FIG. 2 is an intensity distribution of the illumination light 1 in a pupil plane 8 (cf. FIG. 1) or in a plane of the illumination optical unit 7 conjugate thereto. The illumination setting takes the form for example of a hexapole setting with six illumination poles 9.

The six illumination poles 9 lie within an elliptical outer edge contour 10, which is indicated in a dashed manner in FIG. 2. This edge contour 10 follows an ellipse with a ratio between the major semiaxis parallel to the x axis and the minor semiaxis parallel to the y axis of 2:1. Other axis ratios of the elliptical edge contour 10 in the range from 10:1 to 1.1:1 are also possible, for example of 1.5:1, 1.6:1, 2.5:1, 3:1, 4:1, 5:1 or 8:1.

The elliptical edge contour 10 is produced by an illumination aperture stop 11 of the illumination optical unit 7, which marginally delimits a beam of the illumination light 1 that is incident on the illumination aperture stop 11. Correspondingly, in a stop plane extending parallel to the xy plane, the illumination aperture stop 11 has in the two mutually perpendicular directions x and y two stop diameters that differ from one another by at least 10%, in the present case by 100%, the corresponding equivalents of which are denoted in FIG. 2 by Bx and By. The illumination aperture stop 11 has the greater stop diameter Bx perpendicular to the plane of incidence yz of the illumination light 1 on the object 5.

The metrology system 2 is designed for the examination of anamorphic masks with different structure scaling factors in x and y. Such masks are suitable for producing semiconductor elements by use of anamorphic projection apparatuses.

A numerical aperture of the illumination and imaging light 1 in the xz plane may be 0.125 on the reticle side and in the yz plane 0.0625 on the reticle side.

Figure 3:
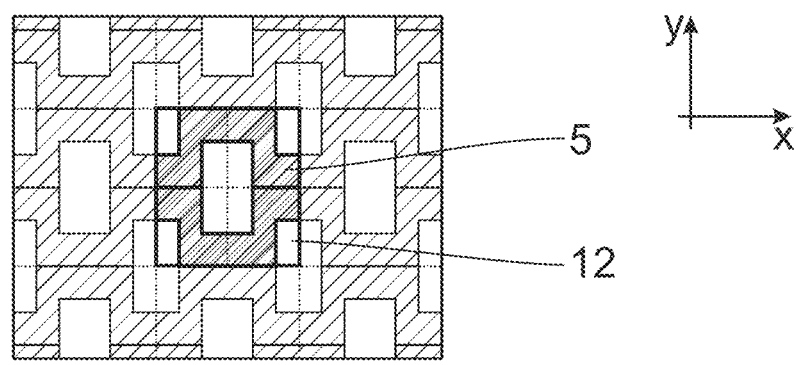
FIG. 3 shows a plan view of the object to be imaged.

FIG. 3 shows a plan view of the object 5. Structures on the reticle 5 are stretched in the y direction by a factor of 2. This means that a partial structure, for example the rectangular structure 12 in the lower right-hand corner of the object 5 shown in FIG. 3, which is intended to be imaged in a 1:1 structure, has an x/y aspect ratio of 1:2.

After reflection at the object 5, the illumination and imaging light 1 enters an imaging optical unit or projection optical unit 13 of the metrology system 2, which in FIG. 1 is likewise schematically indicated by a dashed border. The imaging optical unit 13 serves for imaging the object 5 towards a spatially resolving detection device 14 of the metrology system 2. The detection device 14 is designed for example as a CCD detector.

Figure 4:
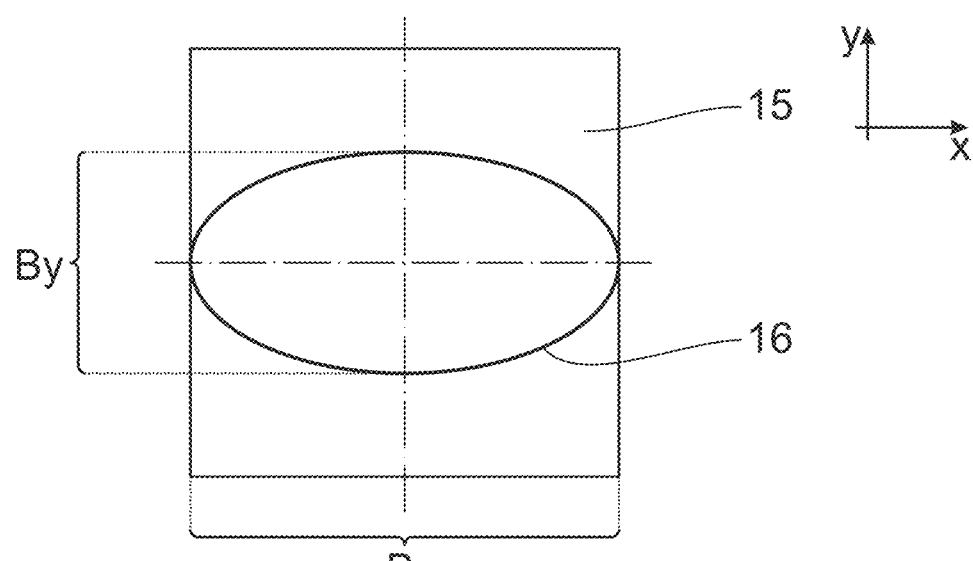
FIG. 4 shows a plan view of an imaging aperture stop for the marginal delimitation of an imaging light beam in the imaging optical unit.

The imaging optical unit 13 comprises an imaging aperture stop 15 arranged downstream of the object 5 in the beam path (cf. also FIG. 4) for the marginal delimitation of an imaging light beam. The imaging aperture stop 15 is arranged in a pupil plane 8a of the imaging optical unit 13. The pupil planes 8 and 8a may coincide; this is not mandatory however.

It is also possible to dispense with the imaging aperture stop 15 in the metrology system 2.

The imaging aperture stop 15 has an elliptical edge contour 16 with an x/y semiaxis ratio of 2:1. Therefore, in a stop plane extending parallel to the xy plane, the imaging aperture stop 15 has in two mutually perpendicular directions x, y two stop diameters that differ from one another by at least 10%, which are in turn denoted in FIG. 4 by Bx and By. What was said above with respect to the corresponding diameter ratio of the illumination aperture stop 11 applies to the diameter ratio Bx:By in the range between 10:1 and 1.1:1.

The imaging aperture stop 15 also has the greater stop diameter Bx perpendicular to the plane of incidence yz of the illumination and imaging light 1 on the object 5. Also in the case of the imaging aperture stop 15, the diameter Bx is twice the diameter By.

The detection device 14 is in signaling connection with a digital image processing device 17.

The object 5 is carried by an object holder 18. This object holder can be displaced by a displacement drive 19 on the one hand parallel to the xy plane and on the other hand perpendicularly to this plane, that is to say in the z direction. The displacement drive 19, as also the entire operation of the metrology system 2, is controlled by a central control device 20, which, in a way that is not represented any more specifically, is in signaling connection with the components to be controlled.

The optical set-up of the metrology system 2 serves for the most exact possible emulation of an illumination and an imaging in the course of a projection exposure of the object 5 during the projection-lithographic production of semiconductor devices.

Figure 5:
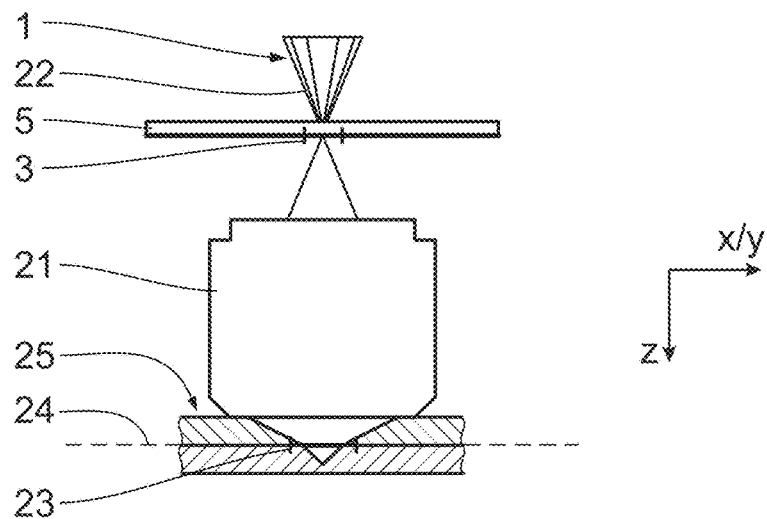
FIG. 5 shows less schematically than in FIG. 1 a side view of an arrangement of a lithographic projection optical unit between the object to be imaged and a wafer, the object being the one that was examined in advance with the metrology system shown in FIG. 1.

FIG. 5 shows the imaging ratios of a lithographic projection optical unit 21 that is used during such a lithographic projection exposure. As a difference from FIG. 1, FIG. 5 shows a transmitting illumination of the object 5 instead of the actually occurring reflecting illumination. A structuring of this illumination light beam 22 on the basis of a defined illumination setting with discrete illumination poles is indicated in an illumination light beam 22 of the illumination and imaging light 1.

The projection optical unit 21, which is part of a projection exposure apparatus that is not otherwise represented, is of an anamorphic configuration, and therefore has a different imaging scale in the xz plane than in the yz plane. An object-side numerical aperture of the projection optical unit 21 is 0.125 in the xz plane and 0.0625 in the yz plane. An image-side numerical aperture of the projection optical unit 21 is 0.5 both for the xz plane and for the yz plane. This gives an imaging scale of 4× in the xz plane and an imaging scale of 8× in the yz plane, that is to say a reduction factor on the one hand of 4 and on the other hand of 8.

During the projection exposure, the projection optical unit 21 projects an image of the object field 3 into an image field 23 in an image plane 24, in which a wafer 25 is arranged.

As a difference from the projection optical unit 21 of the projection exposure apparatus, the projection optical unit 13 of the metrology system 1 is not anamorphic, but instead has the same magnifying imaging scale $\beta_{MS}$ of more than 100, for example of 500 or of 850, both in the xz plane and in the yz plane. The projection optical unit 13 of the metrology system is therefore isomorphic.

Figure 6:
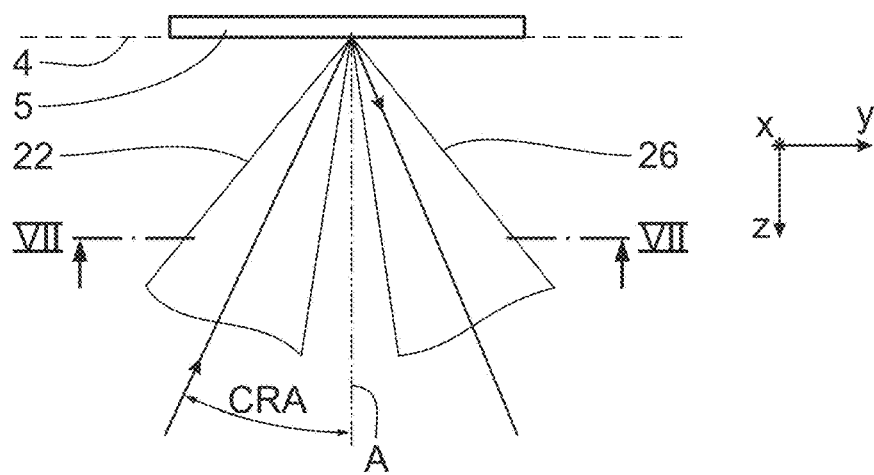
FIG. 6 shows schematically in a section in a plane of incidence a reflection of the illumination and imaging light at the object during the projection exposure.
Figure 7:
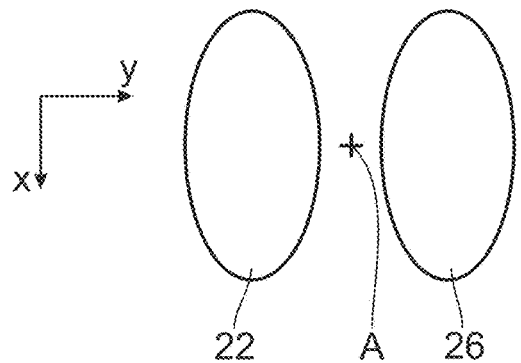
FIG. 7 shows a section through the incident illumination light beam and the emerging imaging light beam according to line VII-VII in FIG. 6.

FIGS. 6 and 7 illustrate the reflection ratios when using an illumination with an elliptical edge contour, which can then be used in the reflection of an anamorphic projection optical unit adapted correspondingly thereto, such as the projection optical unit 21, or an optical unit with an elliptical imaging aperture stop, as in the case of the projection optical unit 13. On account of the elliptical cross section on the one hand of the illumination light beam 22 and on the other hand of an imaging light beam 26 reflected by the object 5, a small chief-ray angle of incidence CRA of 6° or less can be realized, since the light beams 22, 26 respectively have the same numerical aperture in the yz plane of 0.0625. In the xz plane perpendicular thereto, the light beams 22 and 26 have the greater numerical aperture of 0.125, which does not cause any disturbance there.

A central axis, from which the chief-ray angle CRA is measured and which is perpendicular to the object plane 4, is denoted in FIGS. 6 and 7 by A.

Data that can be used to deduce an imaging behavior of the structure of the object 5 that is illuminated in the object field 3 by the projection optical unit 21 in the region of the image plane 24 are generated during the 3D aerial-image measurement. For this purpose, the metrology system 2 is used, the imaging scale ratio of 2:1 of the projection optical unit 21 in the two mutually perpendicular directions y and x, that is to say in the two mutually perpendicular planes yz and xz, being taken into account by using a metrology system projection optical unit 13 that is not anamorphic.

Figure 8:
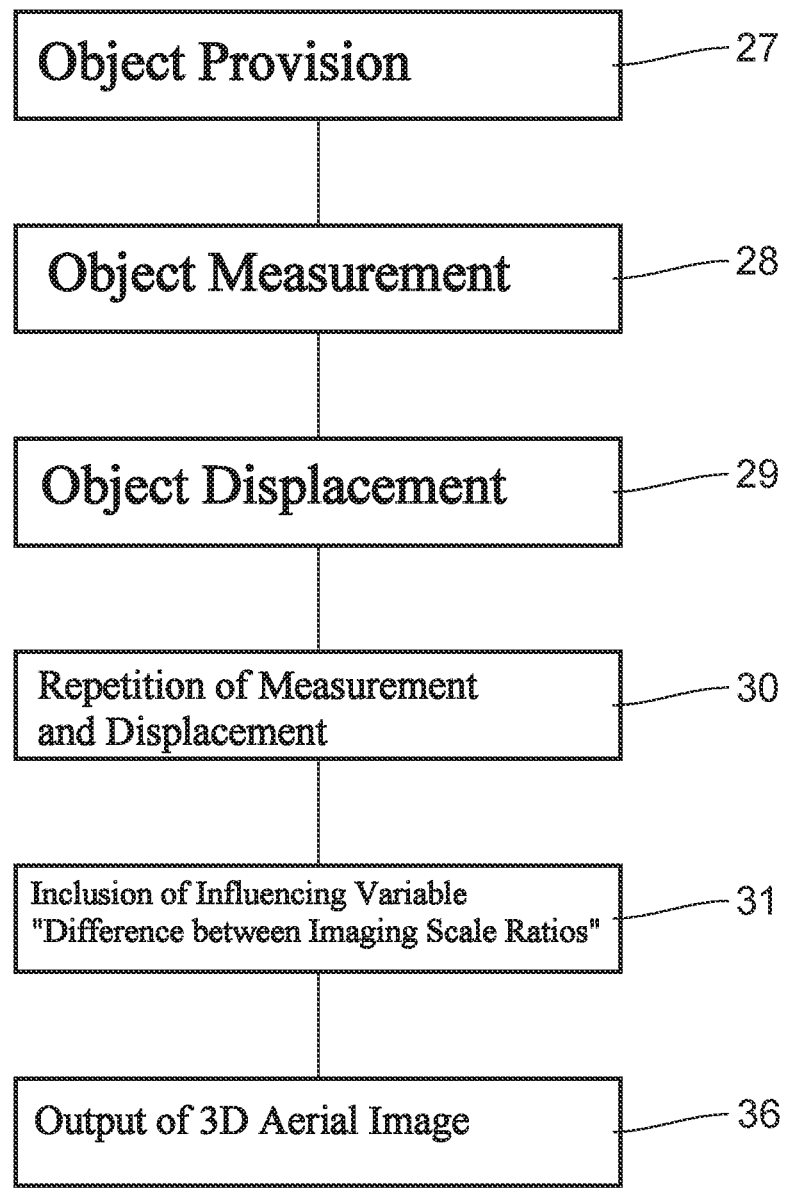
FIG. 8 shows a flow diagram of a method for three-dimensionally measuring a 3D aerial image in the region around an image plane during the imaging of the lithography mask.
Figure 9:
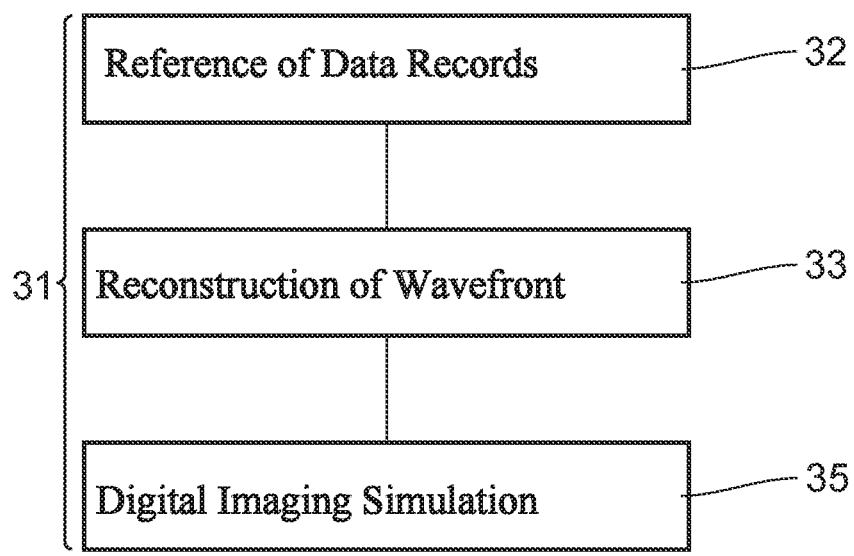
FIG. 9 shows a flow diagram that illustrates in greater detail method steps for the inclusion of an influencing variable that corresponds to the ratio of imaging scales of the projection optical unit in mutually perpendicular directions.

The method for 3D aerial image measurement is explained below on the basis of FIGS. 8 and 9.

First, the object 5 to be measured, that is to say the lithography mask to be measured, is provided in a step 27. Then, the intensity distribution of the imaging light 1 is measured in the region of an image plane 14*a*, in which the detection device 14 of the metrology system 1 is arranged. This takes place in a measuring step 28. In the measuring step 28, the detection device 14 detects a 2D imaging-light intensity distribution within a detection field, into which an image of the object field 3 is projected by the projection optical unit 13 of the metrology system. The measured intensity distribution is then in each case stored and passed on to the digital image processing device 17.

Then the lithography mask 5 is displaced with the aid of the displacement drive 19 perpendicularly to the object plane 4 by a predetermined displacement Δz. This takes place in a displacement step 29.

The measuring step 28 and the displacement step 29 are then repeated by carrying out a repetition step 30 as often as is needed until a sufficient number of 2D imaging-light intensity distributions to reproduce a 3D aerial image are measured by use of the detection device 14. By repeating the measuring step 28 and the displacement step 29 for different z positions of the object 5, the 2D imaging-light intensity distribution is therefore measured for example at five, seven, nine or eleven positions, each lying Δz apart, the object 5 lying exactly in the object plane 4 in the case of a midway displacement step 29. In FIG. 1, corresponding displacement z positions of the object 5 are indicated in a dash-dotted manner. The case in which five z positions, each lying Δz apart, are measured is shown, the z position that is shown in FIG. 1, in which the object 5 lies in the object plane 4, representing the middle of the five z positions to be measured.

In the case of this measuring method, the third dimension of the 3D aerial image, to be specific the z dimension, is made accessible to the measurement by z displacement of the object 5. Since the 3D aerial image is intended to emulate an anamorphic imaging, to be specific an imaging by the lithographic projection optical unit 21, in the region of the image plane 14*a* each displacement step 29 leads to a defocusing in the z direction. Defocusing values on the one hand in the xz plane and on the other hand in the yz plane differ from one another on account of the xz/yz imaging scale ratio of the lithographic projection optical unit 21 to be emulated. The difference between the imaging scale ratios on the one hand of the isomorphic projection optical unit 13 of the metrology system and on the other hand of the anamorphic projection optical unit 21 of the projection exposure apparatus to be emulated is taken into account in the measuring method by including an influencing variable that corresponds to the ratio of the imaging scales of the lithographic projection optical unit 21. This takes place in an inclusion step 31, which is represented in greater detail in the flow diagram of FIG. 9.

The measurement is carried out with a measuring optical unit of the metrology system 1, the imaging scale of which is the same in mutually perpendicular directions (xz/yz). The inclusion step 31 is performed exclusively by converting the data of the measured 2D imaging-light intensity distribution. This conversion is carried out by the digital image processing device 17.

When carrying out the inclusion step 31, first the data records of the measuring steps 28 are referred to, that is to say the various measured 2D imaging-light intensity distributions at the various z positions of the object 5 that were measured in the course of the previous sequence of the repeating steps "measuring step 28/displacement step 29" and stored in a memory of the digital image processing device 17. This takes place in a reference step 32.

In preparation for the inclusion, an electromagnetic wavefront of the imaging light 1 after interaction of the imaging light 1 with the object 5 is reconstructed in a reconstruction step 33 from the data used for reference in this way. This reconstruction takes place in particular in the region of the image plane 14*a* of the metrology system 1. In the reconstruction step 33, a phase reconstruction of the electromagnetic wavefront of the imaging light 1 may be performed. In particular, the phase and amplitude of a 3D object spectrum and the partially coherent superimposition thereof are reconstructed. A polarization-dependent reconstruction does not take place.

Various methods of phase reconstruction that are already known from the literature may be used for carrying out the reconstruction step 33. These include methods that include various 2D imaging-light intensity distribution sequences produced by correspondingly carrying out the series of steps 28 to 30 repeatedly, part of the optical system of the metrology system 1 being changed in each of these sequences, which is also known as diversification. Steps 28 to 30 may therefore represent part of the phase reconstruction and be used in the reconstruction of the wavefront in step 33.

In the case of a variant of the phase reconstruction, a defocusing diversification takes place. This has already been discussed above by explaining steps 28 to 30.

Algorithms that are used here may be for example: Transport of Intensity Equation, Iterative Fourier Transform Algorithms (IFTA, e.g. Gerchberg-Saxton) or methods of optimization, for example by use of backpropagation. The Transport of Intensity Equation (TIE) algorithm is described in the technical article "Critical assessment of the transport of intensity equation as a phase recovery technique in optical lithography", Aamod Shanker; Martin Sczyrba; Brid Connolly; Franklin Kalk; Andy Neureuther; and Laura Waller, Proc. SPIE 9052, Optical Microlithography XXVII, 90521D (Mar. 31, 2014); DOI:10.1117/12.2048278. The "Gerchberg-Saxton" algorithm is described in Fienup, J. R. (Aug. 1, 1982) "Phase retrieval algorithms: a comparison", Applied Optics 21 (15): 2758-2769. Bibcode:1982 Applied Optics, Vol. 21, pp. 2758-2769, DOI:10.1364/AO.21.002758. The "backpropagation" method of optimization is described in "General framework for quantitative three-dimensional reconstruction from arbitrary detection geometries in TEM", Phys. Rev. B 87, 184108—published May 13, 2013, Wouter Van den Broek and Christoph T. Koch.

A further variant for an algorithm that can be used in the phase reconstruction is Stokes polarimetry. This algorithm is described for example in Optics Express, Jun. 2, 2014; 22(11):14031-40; DOI: 10.1364/OE.22.014031, "All-digital wavefront sensing for structured light beams", Dudley A, Milione G, Alfano R R, and Forbes A.

When using a phase reconstruction, it is also possible to dispense with the elliptical imaging aperture stop 15. The optical effect of the aperture stop can also be brought about digitally.

As an alternative to a defocusing diversification, an illumination direction diversification can also be carried out for carrying out the reconstruction step 33. An example of this is Fourier ptychography. This algorithm is described in the technical article "Wide-field, high-resolution Fourier ptychographic microscopy", Guoan Zheng et al., Nature Photonics, Advance online publication 28.07.2013, DOI: 10.1038/NPHOTON.2013.187.

This involves measuring a 2D imaging-light intensity distribution for each illumination direction and calculating back to the phase and amplitude of the electromagnetic wavefront by use of an algorithm. The algorithms IFTA or backpropagation can in turn be used here.

A further possibility for carrying out the reconstruction step 33 is a general pupil manipulation, as is used for example in "Spatial Light Interference Microscopy (SLIM, cf. the technical article Wang et al. Optics Express, 2011, volume 19, no. 2, page 1017). Here, four images are recorded for example, each with a different phase-shifting mask, which is arranged in a detection pupil, that is to say for example in the pupil plane 8a of the projection optical unit 13 of the metrology system 1.

In principle, the phase reconstruction of the electromagnetic wavefront may also be performed without such a diversification. Examples of this are methods of interferometry and digital holography. In interferometry, a reference beam is needed. In digital holography, for example, a grating is introduced into the detection pupil. The individual orders of diffraction are then brought to a state of interference on the detector. By way of example, these methods of interferometry and digital holography are described in U. Schnars, W. Jüptner (2005), Digital Holography, Springer, and Wen, Han; Andrew G. Gomella, Ajay Patel, Susanna K. Lynch, Nicole Y. Morgan, Stasia A. Anderson, Eric E. Bennett, Xianghui Xiao, Chian Liu, Douglas E. Wolfe (2013), "Sub-nanoradian X-ray phase-contrast imaging using a far-field interferometer of nanometric phase gratings", Nature Communications 4, Bibcode:2013NatCo . . . 4E2659W, DOI: 10.1038/ncomms3659.

For a given illumination setting, for which the imaging function of the lithographic projection optical unit 21 is intended to be emulated by the metrology system 1, a phase reconstruction can be realized by fine sampling of the illumination pupil used with these illumination settings, for example of the intensity distribution shown in FIG. 2. The illumination setting used is in this case approximated by many small virtually coherent illumination monopoles, which are measured sequentially. Such monopoles are indicated in FIG. 2 by way of example at 34. A phase reconstruction is then carried out for each of these monopoles 34, so that, after interaction with the object 5, the partially coherent wave to be determined can be described as a superimposition of approximately coherent waves, that is to say the results of the respective phase reconstruction for monopole illumination. Such scanning of the illumination pupil is used in Fourier ptychography as diversification. A partially coherent field can therefore be described as a superimposition of many virtually coherent fields that are produced by the monopole sampling.

After the reconstruction step 33, a digital simulation of the imaging is performed with the imaging scale ratio of the lithographic projection optical unit 25. This is performed in a digital simulation step 35.

The electromagnetic wavefront calculated in the reconstruction step 33 is thereby manipulated in the same way as it would be manipulated in the propagation by a corresponding anamorphic system. This may take place by using a digital elliptical imaging aperture stop corresponding to the imaging aperture stop 15 explained above. At the same time, it must be ensured by the digital manipulation that, on the image side, as also in the case of the lithographic projection optical unit 25, the numerical aperture in the xz plane is equal to the numerical aperture in the yz plane. Such a digital manipulation may be performed by a digital cylindrical lens or by adding an astigmatic wavefront. The addition of an astigmatic wavefront may be performed by addition of a contribution of a Zernike polynomial Z5. Zernike polynomials Zi ($i=1, 2, \ldots$) are known for example in the Fringe notation from the mathematical and optical literature. An example of this notation is provided by the Code V Manual, version 10.4, pages C-6 ff. The resultant astigmatic wavefront can then be calculated in each propagation plane.

Correspondingly, the output of the resultant 3D aerial image with the inclusion of the influencing variable can then be output in an output step 36.

The phase reconstruction may include a Fourier transformation step, with which a complex, that is to say phase-including, amplitude distribution is calculated from a calculated phase. After digital astigmatism manipulation, it is then possible to calculate back into the image field with the aid of an inverse Fourier transformation.

In the course of the phase reconstruction, a three-dimensional (3D) Fourier transformation may also take place.

Alternatively, an intensity Fourier transformation of the 2D imaging-light intensity distributions determined in the sequence of steps 28 to 30 may be carried out to carry out the reconstruction step 33, for which purpose these intensity distributions are provided in advance with periodic boundary conditions by use of known mathematical techniques. In this connection, reference is made to WO 2008/025433 A2 and DE 10 2007 009 661 A1.

The inclusion step 31 is then performed by selecting the xy directional components of the generated intensity Fourier transformations while taking into account the xy imaging scale ratio of the lithographic projection optical unit 21. A Fourier image is therefore composed, the x component of which was recorded during a displacement by a first increment $\Delta z_1$ with a sequence of method steps 28 to 30, and the y component of which is provided by using Fourier components of the intensity distributions of a sequence that were recorded with an incremental ratio $\Delta z_2$. For directional components that form an angle $\varphi$ with the x axis of between 0° and 90°, Fourier-transformed 2D intensity data that were recorded with an intermediate increment $\Delta z i$ are used. The respective increment $\Delta z i$ scales with the angle $\varphi$ of the direction considered in each case of the Fourier component and the x axis.

The function $\Delta z i (\varphi)$ can be varied between the increments $\Delta z_1$ for the x axis and the increments $\Delta z_2$ for the y axis linearly or by use of an appropriately selected matching function, for example by use of a quadratic function, a sine function and a $\sin e^2$ function.

The $\Delta z i$ incremental measurements of the 2D imaging-light intensity distributions do not all have to be carried out in reality; if a measurement for a z value between two measurements carried out in reality is needed, an interpolation between these two 2D imaging-light intensity distributions can also be carried out. This interpolation may be performed for example with the aid of a nearest-neighborhood, linear, bicubic or spline interpolation function. The interpolation may take place in the Fourier domain, but also in the spatial domain.

An imaging with the metrology system 2 may be carried out with an elliptical imaging aperture stop 15, but alternatively also with an oval or rectangular stop. If no phase reconstruction is carried out, it is necessary to use an imaging aperture stop with an x/y aspect ratio that corresponds to the ratio of the imaging scale in the x and y directions of an imaging optical unit to be emulated or to be reconstructed, that is to say has for example an aspect or diameter ratio in the range between 10:1 and 1.1:1.

The Fourier image thus manipulated and composed of the various directional components is then transformed back by use of an inverse Fourier transformation, so that the desired 3D aerial image is obtained.

The resultant image intensity distribution may then also be distorted by software, in particular be scaled differently in the x direction than in the y direction, in order to reproduce an amorphism produced by the lithographic projection optical unit 21.

Steps 28 to 30 are therefore not mandatory. After the providing step 27, a reconstruction of the wavefront may also be performed in the reconstruction step 33 by one of the variants described above.

A method for three-dimensionally measuring a 3D aerial image in the region around the image plane 24 during the imaging of the lithography mask 5, which is arranged in the object plane 4, while taking into account a selectable imaging scale ratio of an imaging optical unit to be emulated or to be reconstructed by using intensity reconstruction of an electromagnetic wavefront of the imaging light 1, is explained in still more detail below on the basis of FIG. 10 ff.

This involves first measuring a stack of 2D imaging-light intensity distributions respectively differing by a $\Delta z$ displacement of the test structure in the region of the plane 14a with the detection device 14 by repeating steps 28 to 30. This takes place with the imaging aperture stop 15 used, shown in FIG. 4.

FIGS. 11 to 14 show by way of example for a rectangle 5 as an example of a test structure, which is used instead of the lithography mask 5, various measurement results for the resultant 2D imaging-light intensity distribution. The rectangle has an x/y aspect ratio of 1:2.

Figure 11:
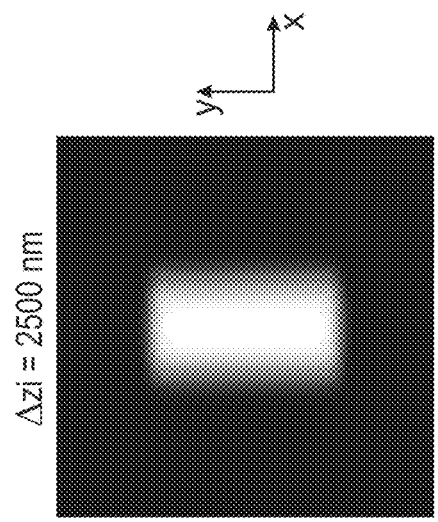
FIGS. 11 to 14 show in each case a 2D intensity distribution of an imaging of a rectangular test structure for various defocusing displacements $\Delta z$ of the test structure, respectively recorded in the xy plane.

FIG. 11 shows the measured 2D imaging-light intensity distribution for a resultant image-side defocusing $\Delta z$ of 1600 nm.

Figure 12:
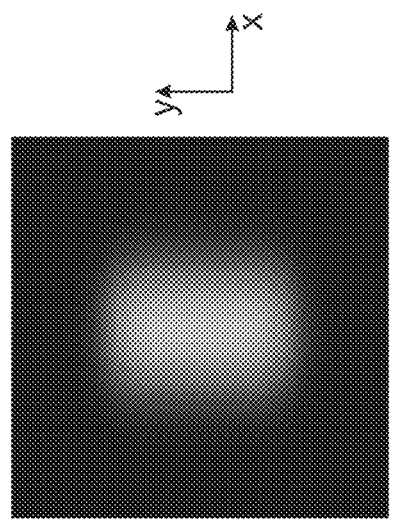

FIG. 12 shows the measured 2D imaging-light intensity distribution for a defocusing $\Delta z$ of 2500 nm.

Figure 13:
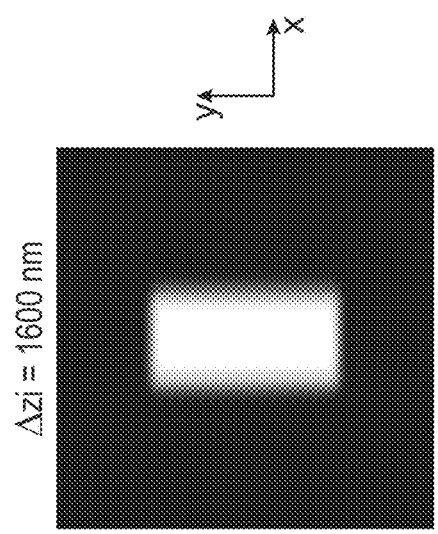
Figure 14:
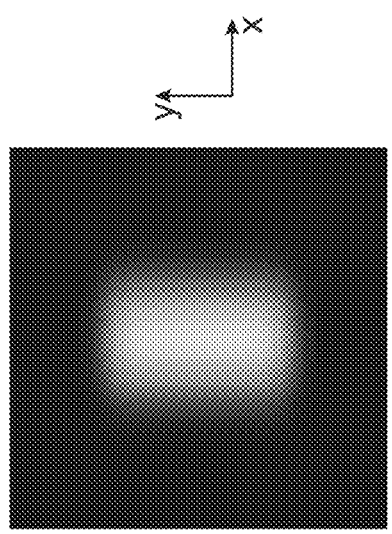

FIG. 13 shows the measured 2D imaging-light intensity distribution for a defocusing $\Delta z$ of 4900 nm. FIG. 14 shows the measured 2D imaging-light intensity distribution for a defocusing $\Delta z$ of 6400 nm.

The progressive defocusing that can be seen in FIGS. 11 to 14 appears to be weaker in the y direction for a given displacement $\Delta z$ than in the x direction, which is explained by the Bx/By aspect ratio of the imaging aperture stop 15, which leads to a greater depth of field in the y direction in comparison with the x direction.

To achieve an intensity reconstruction of the 3D aerial image of the imaging optical unit to be emulated with a predetermined imaging scale ratio different from 1, a conversion of the measured focus stack with a multiplicity of 2D imaging-light intensity distributions of the type shown in FIGS. 11 to 14 for various displacements $\Delta z$ into a synthetic result image of the 3D aerial image of this imaging optical unit then takes place.

By way of example, a magnification scale of the imaging optical unit 21 to be emulated of 1/4 in the x direction, $\beta_x$, and of 1/8 in the y direction, $\beta_y$, is assumed. The imaging optical unit 13 of the metrology system 2 has an isomorphic magnification factor $\beta_{MS}$ of 850.

The displacement $\Delta z$ of the test structure or the lithography mask 5 is also referred to below as $\Delta z_{LM}$.

With the aid of selected 2D imaging-light intensity distributions for specific displacements $\Delta z$, as shown by way of example in FIGS. 11 and 14, a synthetic image of the lithographic projection optical unit 21 is then produced. For this purpose, an intensity Fourier transformation of each of the 2D imaging-light intensity distributions is generated. The result is in each case a 2D intensity Fourier transform. By way of example, the absolute value of the 2D intensity Fourier transform of the 2D imaging-light intensity distributions shown in FIGS. 11 to 14 is shown in FIGS. 15 to 18.

A new synthetic result image is then produced from these intensity Fourier transforms. For this purpose, directional components of the first-generated 2D intensity Fourier transforms are selected, taking into account the imaging scale ratio of the lithographic projection optical unit 21. A displacement $\Delta zi$ of a 2D imaging-light intensity distribution respectively selected for this purpose scales here with the alignment of the directional components. The following procedure is followed for this:

The intensities and phases (that is to say real and imaginary components) of the Fourier image that was recorded in the plane $\Delta zi = \Delta z_{LM}/\beta_x^2$ are used on the x axis.

The intensities and phases of the Fourier image that was recorded in the plane $\Delta zi = \Delta z_{LM}/\beta_y^2$ are used on the y axis.

The intensities and phases of a Fourier image that was recorded in a defocusing plane $\Delta zi$ between $\Delta z_{LM}/\beta_x^2$ and $\Delta z_{LM}/\beta_y^2$ are used for all of the pixels in between. The function for the interpolating calculation of the defocusing is intended to be continuous and advantageously continuously differentiable and advantageously monotonic from 0° to 90°.

Two examples of an assignment of respective $\Delta z$ displacement positions to the directional components, that is to say the various angles $\varphi$, are given below:

$\Delta zi = \Delta z_{LM} * 1/(\beta_x + (\beta_y - \beta_x) * \sin^2 \varphi)^2$ (=example assignment function 1)

$\Delta zi = \Delta z_{LM} * (1/\beta_x + (1/\beta_y - 1/\beta_x) * \sin^2 \varphi)^2$ (=example assignment function 2)

Figure 10:
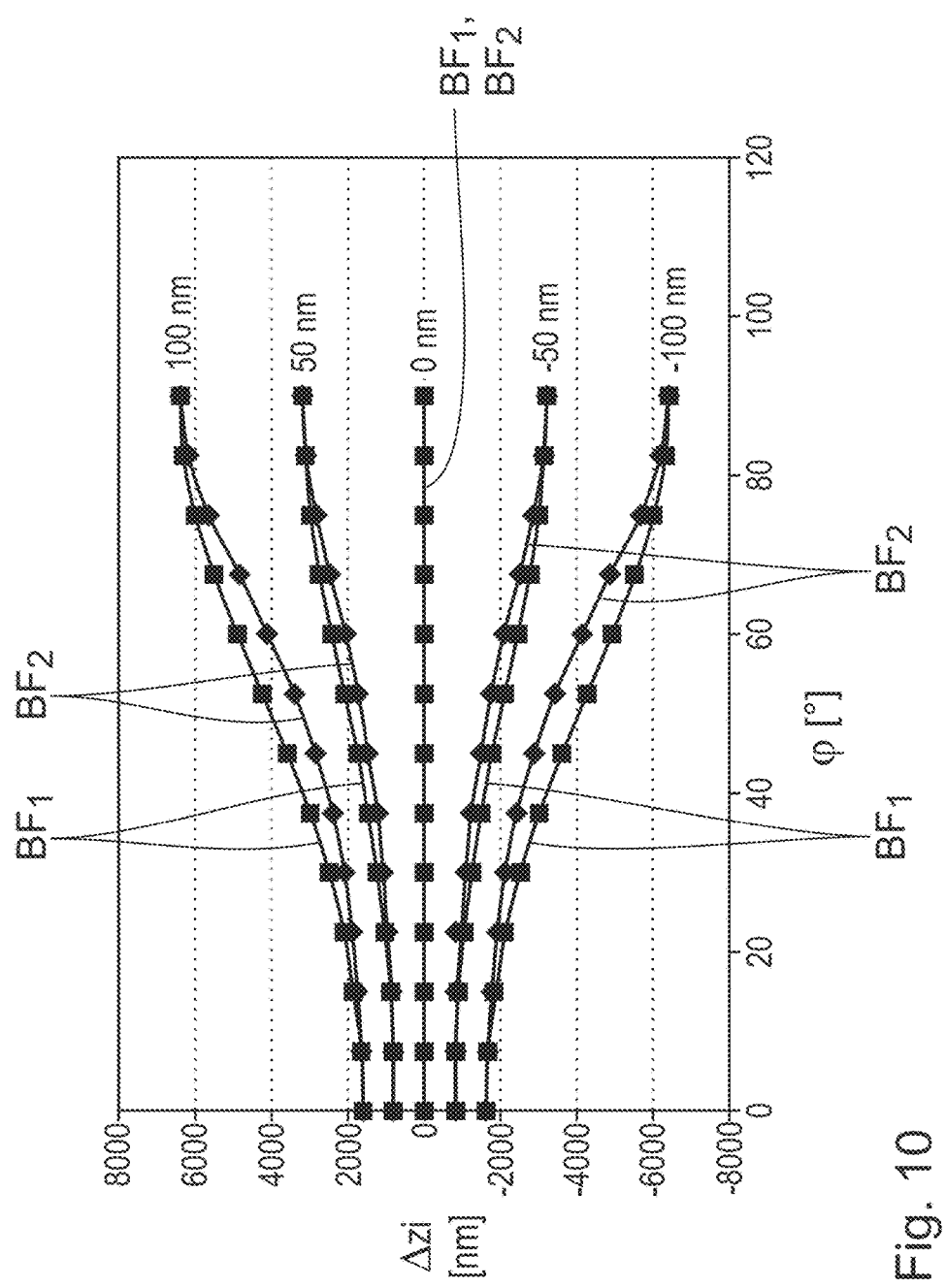
FIG. 10 shows in a diagram a dependence of a displacement $\Delta z_i$ of a field plane from an optimum focal plane of the imaging optical unit, this displacement $\Delta z_i$ being used for an intensity reconstruction during the measurement of a 3D aerial image, on an angle $\varphi$ of a directional component of a Fourier transform used for the calculation of the 3D aerial image, the dependence being shown for a given imaging scale ratio of the imaging optical unit and for various reconstruction displacements of the object plane from the optimum focal plane of the imaging optical unit and also for two different continuously differentiable functions describing the angle dependence.

FIG. 10 illustrates the profile of these example assignment functions, that is to say the dependence $\Delta zi (\varphi)$ for values of $\Delta z_{LM}$ of −100 nm, −50 nm, 0 nm, 50 nm and 100 nm. The curves assigned to the example assignment function 1 are denoted by BF1 and the curves assigned to the example assignment function 2 are denoted by BF2.

A further example of an assignment function in the manner of the example assignment functions 1 and 2 described above is the mean value of these two example assignment functions.

A focus stack with very many images and a very small increment is needed for this calculation. In practice, however, usually fewer images are measured (for example to save measuring time) and a greater increment is chosen. In this case, the images between the various measured images can be interpolated. The interpolation may be performed in the image domain (that is to say before the Fourier transformation) or in the Fourier domain (after the Fourier transformation). Depending on what accuracy is required, nearest neighbour, linear, bicubic, spline or some other method comes into consideration as the method of interpolation.

Advantageously, the overall focal region is chosen to be of such a size that it is only necessary to interpolate and not extrapolate between the focal planes.

A numerical realization of a directional component selection corresponding to one of these example assignment functions is illustrated by digital selection functions shown in FIGS. 19 to 22. There, the digital selection functions have the value 1 where there are white areas, and the value 0 everywhere else.

On the basis of the four 2D imaging-light intensity distributions measured according to FIGS. 11 to 14, an overly coarse determination of the result image is shown, with correspondingly just four different defocusing values and assigned selection functions. The latter are chosen such that each point on the x/y area defined by the digital selection functions is selected precisely once. The assignment of these directional components $\varphi$ to the defocusing value $\Delta z_i$ is performed here by way of the assignment example function BF1, that is to say the uppermost curve in FIG. 10.

Figure 15:
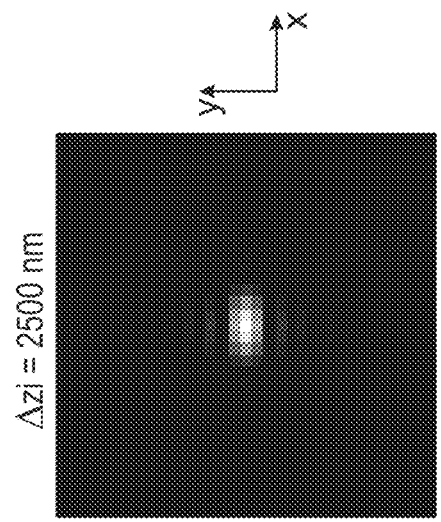
FIGS. 15 to 18 show the absolute value of the 2D intensity Fourier transforms assigned to the intensity distributions of FIGS. 11 to 14.

A result image for $\Delta z_{LM}$=100 nm is calculated. The intensity Fourier transform shown in FIG. 15 is selected for the x axis of this result image. For this purpose, this intensity Fourier transform shown in FIG. 15 is multiplied by the digital selection function shown in FIG. 19, which is 1 for values that lie in the region of the x axis ($\varphi \approx 0$) and 0 for all other values.

Figure 16:
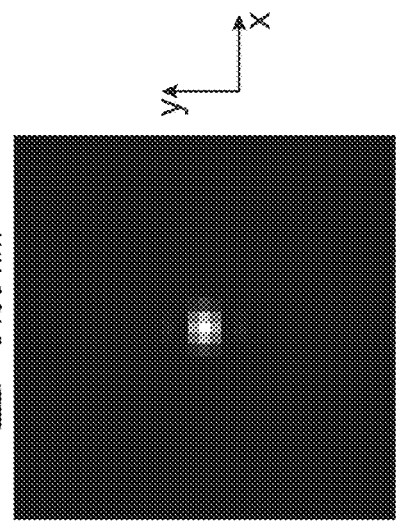
Figure 20:
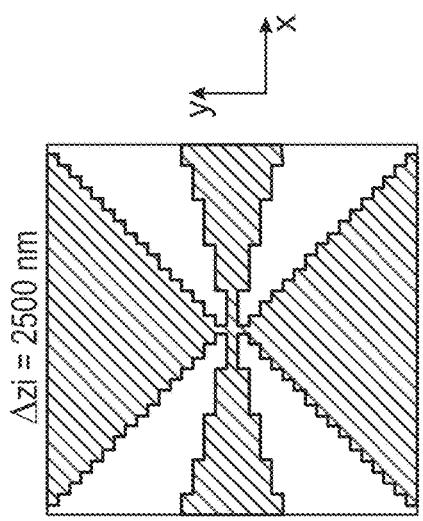

The selection function shown in FIG. 20 is assigned to the intensity Fourier transform shown in FIG. 16 and covers the value $\varphi$ approximately equal to 30°.

Figure 17:
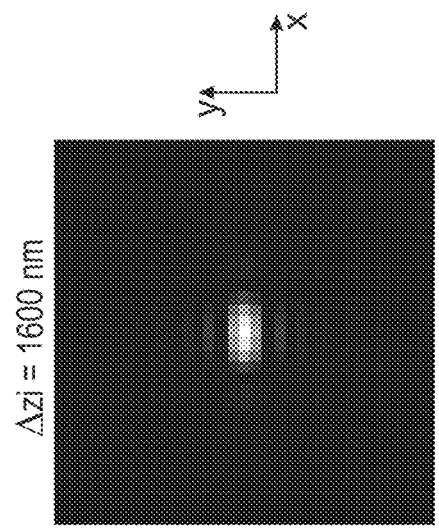
Figure 21:
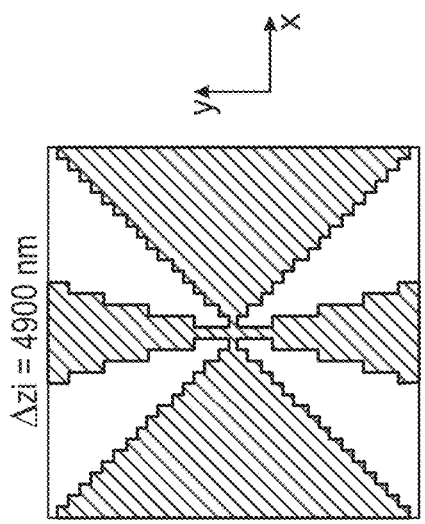

FIG. 21 shows the digital selection function for the intensity Fourier transform shown in FIG. 17 (directional component $\varphi$ approximately equal to 60°).

Figure 18:
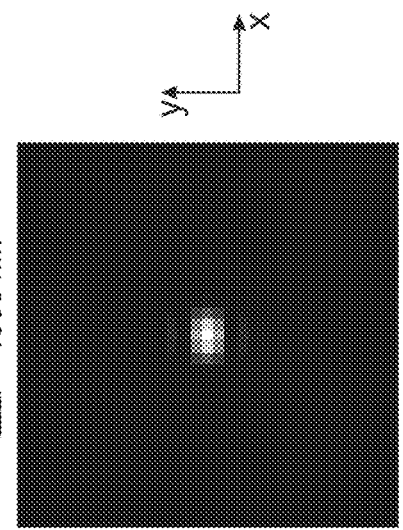
Figure 22:
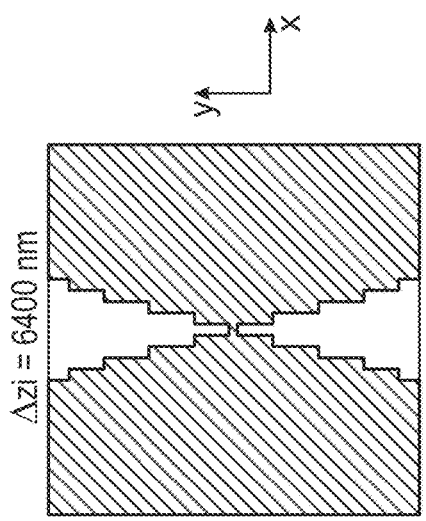

FIG. 22 shows the digital selection function for the intensity Fourier transform shown in FIG. 18 ($\varphi$ approximately equal to 90°).

Therefore, a selection of predetermined angle sectors of the 2D intensity Fourier transforms shown in FIGS. 15 to 18 takes place by way of the selection functions 19 to 22.

Figure 19:
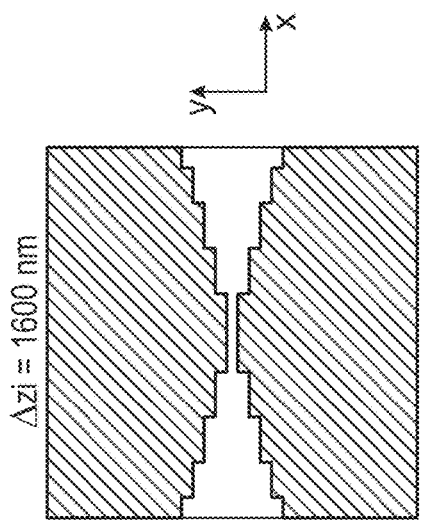
FIGS. 19 to 22 show the digital selection functions assigned to the Fourier transforms shown in FIGS. 15 to 18 for the selection of specific directional components of the Fourier transforms.
Figure 23:
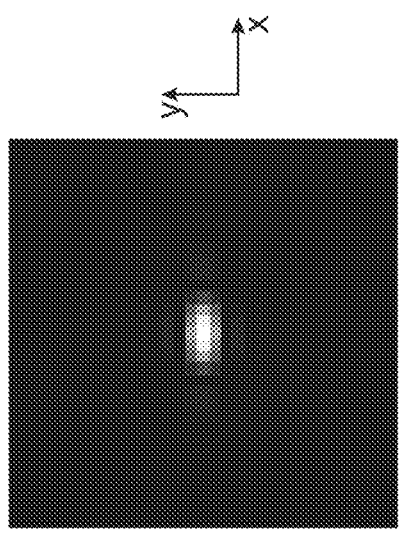
FIG. 23 shows the absolute value of an overall synthetic 2D Fourier transform generated with the aid of the intensity Fourier transforms shown in FIGS. 15 to 18 and the selection functions shown in FIGS. 19 to 22.

Numerically, the intensity Fourier transform shown in FIG. 15 is therefore multiplied by the digital selection function shown in FIG. 19; the intensity Fourier transform shown in FIG. 16 is multiplied by the digital selection function shown in FIG. 20, the intensity Fourier transform shown in FIG. 17 is multiplied by the digital selection function shown in FIG. 21 and the intensity Fourier transform shown in FIG. 18 is multiplied by the digital selection function shown in FIG. 22. The results of these multiplications are added and give an overall synthetic 2D intensity Fourier transform. The absolute value thereof is represented in FIG. 23. Therefore, partial synthetic 2D intensity Fourier transforms generated in an intermediate step and representing in each case the result of the individual multiplications are added to one another. An inverse Fourier transformation of this overall synthetic 2D intensity Fourier transform gives a synthetic raw image shown in FIG. 24.

Figure 24:
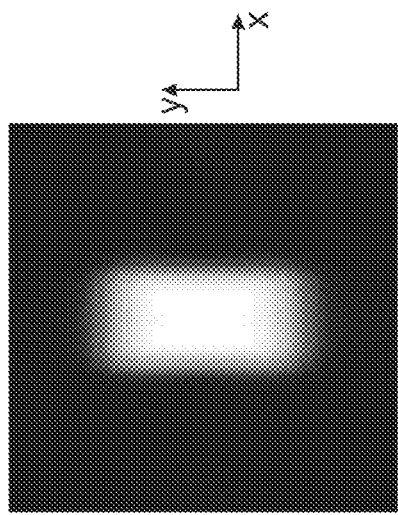
FIG. 24 shows a synthetic image as the result of an inverse Fourier transformation of the overall Fourier transform shown in FIG. 23.
Figure 25:
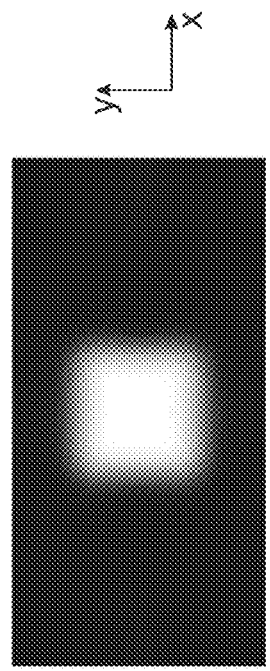
FIG. 25 shows a synthetic result image after distortion of the synthetic image shown in FIG. 24 with a predetermined imaging scale ratio of an imaging optical unit to be emulated or to be reconstructed.

This synthetic raw image shown in FIG. 24 is then distorted with the imaging scale ratio of the lithographic projection optical unit 21, so that the result image shown in FIG. 25 is obtained as the result image for the defocusing $\Delta z_{LM}$ to be emulated of 100 nm. As expected, with this defocusing the edges of the imaged test structure are washed out equally in the x and y directions, since there is a balancing out of the difference in the depth of field in the x and y directions on account of the imaging aperture stop 15 on the one hand and the imaging scale ratio $\beta_x/\beta_y$ on the other hand.

The calculation explained above in connection with FIGS. 11 to 25 is also carried out below for the further $\Delta z$ defocusing displacements of the lithography mask 5, $\Delta z_{LM}$, that are to be emulated. For this purpose, the directional components are selected according to the curves shown in FIG. 10 for the displacements $\Delta z_{LM}$ of 50 nm, 0 nm, −50 nm and −100 nm. For intermediate $\Delta z_{LM}$ displacements, corresponding 2D imaging-light intensity distributions are selected, obtained by either being measured for corresponding $\Delta z_i$ values or by being interpolated.

The method described above in connection with FIGS. 11 to 25 was described with an overly coarse determination of the result image, with just four different defocusing values and assigned selection functions. By using a greater number of defocusing values, for example by using more than five defocusing values, more than ten defocusing values, by using thirteen or seventeen defocusing values, by using more than twenty defocusing values, for example by using twenty-five defocusing values, and at the same time using a corresponding number of selection functions with fine angle sector selection, an accuracy of the determination of the result image can be correspondingly improved further.

As an alternative to a digital selection function, which can only assume the values 0 and 1, as explained above in conjunction with the selection functions shown in FIGS. 19 to 22, a selection function with a continuous transition between the values 0 and 1 may also be used. These alternative selection functions with a continuous transition are also chosen such that they satisfy a normalizing condition, therefore that they ultimately select each point of the xy area with a weighting of 1.

The reconstruction method was described above with a configuration in which a distortion step with the imaging scale ratio of the lithographic projection optical unit 21 represents the last method step. It is alternatively possible to distort the 2D imaging-light intensity distributions first measured in measuring step 28 with the imaging scale ratio of the lithographic projection optical unit 21 and then carry out the other reconstruction steps for measuring the 3D aerial image, in particular the Fourier transformation, the selection of the directional components, the addition of the directional components and the inverse Fourier transformation.

What is claimed is:

1. A method for three-dimensionally measuring a 3D aerial image in the region around an image plane during the imaging of a lithography mask, which is arranged in an object plane, while taking into account a selectable imaging scale ratio in mutually perpendicular directions with the following steps:
   reconstruction of an electromagnetic wavefront of imaging light after interaction thereof with the lithography mask,
   inclusion of an influencing variable that corresponds to the imaging scale ratio, and
   output of the 3D aerial image measured with the inclusion of the influencing variable.

2. The method according to claim 1, wherein the following steps are carried out in the reconstruction:
   measuring a 2D imaging-light intensity distribution in the region of a plane corresponding to the image plane, displacing the lithography mask perpendicularly to the object plane by a predetermined displacement, and repeating the "measuring" and "displacing" steps until a sufficient number of 2D imaging-light intensity distributions to reproduce a 3D aerial image are measured.

3. The method according to claim 2, wherein the measurement is carried out with a measuring optical unit, the imaging scale of which is the same in mutually perpendicular directions, the inclusion of the influencing variable being performed by converting the data of the measured 2D imaging-light intensity distribution.

4. The method according to claim 3, wherein in the reconstruction of the electromagnetic wavefront, a phase reconstruction is performed.

5. The method according to claim 4, wherein for the phase reconstruction, a defocusing of the imaging of the lithography mask is varied.

6. The method according to claim 1, wherein in the reconstruction, a manipulation is performed on the illumination optical unit, with which the lithography mask is illuminated.

7. The method according to claim 1, wherein for the reconstruction, an illumination pupil of the illumination optical unit is varied.

8. The method according to claim 1, wherein the inclusion of the influencing variable in the conversion of the data of the wavefront is performed by a digital simulation of the imaging with the imaging scale ratio.

9. The method according to claim 1, wherein in the reconstruction of the electromagnetic wavefront, an intensity reconstruction is performed.

10. The method according to claim 9, wherein the intensity reconstruction is carried out with the following steps:
measuring a 2D imaging-light intensity distribution in the region of a plane corresponding to the image plane,
displacing the lithography mask perpendicularly to the object plane by a predetermined displacement,
repeating the "measuring" and "displacing" steps until a sufficient number of 2D imaging-light intensity distributions to reproduce a 3D aerial image are measured, and
carrying out an intensity Fourier transformation of the 2D imaging-light intensity distributions obtained to generate a corresponding number of 2D intensity Fourier transforms.

11. The method according to claim 9, wherein the intensity reconstruction is carried out with the following steps:
measuring a 2D imaging-light intensity distribution in the region of a plane corresponding to the image plane,
displacing the lithography mask perpendicularly to the object plane by a predetermined displacement,
repeating the "measuring" and "displacing" steps until a sufficient number of 2D imaging-light intensity distributions to reproduce a 3D aerial image are measured, and
distorting the measured 2D imaging-light intensity distributions with the imaging scale ratio.

12. The method according to claim 10, comprising the following steps:
selecting the directional components of the generated 2D intensity Fourier transforms while taking into account the imaging scale ratio, a displacement during the displacing of the lithography mask perpendicularly to the object plane scaling with the alignment of the directional components, to generate in each case a partial synthetic 2D intensity Fourier transform;
adding the generated partial synthetic 2D intensity Fourier transforms to form an overall synthetic 2D intensity Fourier transform; and
carrying out an inverse intensity Fourier transformation of the overall synthetic 2D intensity Fourier transforms to produce a synthetic raw image.

13. The method according to claim 12, comprising producing a result image by distorting the synthetic raw image with the imaging scale ratio.

14. The method according to claim 12, wherein the selection of the directional components of the generated 2D intensity Fourier transforms is performed by multiplying each of the generated 2D intensity Fourier transforms by an assigned selection function for the selection of predetermined angle sectors of the 2D intensity Fourier transforms, the selection function being dependent on the displacement perpendicularly to the object plane and on the imaging scale ratio, to generate the respective partial synthetic 2D Fourier transforms.

15. The method according to claim 14, comprising using a digital selection function.

16. A metrology system for three-dimensionally measuring a 3D aerial image in the region around an image plane during the imaging of a lithography mask, which is arranged in an object plane, in which the metrology system is configured to take into account a selectable imaging scale ratio in mutually perpendicular directions with the following steps:
reconstruction of an electromagnetic wavefront of imaging light after interaction thereof with the lithography mask,
inclusion of an influencing variable that corresponds to the imaging scale ratio, and
output of the 3D aerial image measured with the inclusion of the influencing variable;
wherein the metrology system comprises:
an illumination optical unit for illuminating the lithography mask to be examined, and
an imaging optical unit for imaging the object towards a spatially resolving detection device.

17. The metrology system of claim 16, in which the metrology system is configured to carry out the following steps in the reconstruction:
measuring a 2D imaging-light intensity distribution in the region of a plane corresponding to the image plane,
displacing the lithography mask perpendicularly to the object plane by a predetermined displacement, and
repeating the "measuring" and "displacing" steps until a sufficient number of 2D imaging-light intensity distributions to reproduce a 3D aerial image are measured.

18. The metrology system of claim 17, comprising a measuring optical unit configured to carry out the measurement, the imaging scale of which is the same in mutually perpendicular directions, the inclusion of the influencing variable being performed by converting the data of the measured 2D imaging-light intensity distribution.

19. The metrology system of claim 18, wherein the system is configured to perform a phase reconstruction in the reconstruction of the electromagnetic wavefront.

20. The metrology system of claim 19, wherein the system is configured to vary a defocusing of the imaging of the lithography mask for the phase reconstruction.

* * * * *

UNITED STATES PATENT AND TRADEMARK OFFICE
CERTIFICATE OF CORRECTION

PATENT NO. : 10,068,325 B2
APPLICATION NO. : 15/410918
DATED : September 4, 2018
INVENTOR(S) : Ulrich Matejka et al.

Page 1 of 1

It is certified that error appears in the above-identified patent and that said Letters Patent is hereby corrected as shown below:

In the Specification

Column 14
Line 50, delete "$\Delta zi = \Delta z_{LM} * (1/\beta_x + (1/\beta_y - 1/\beta_x) * \sin^2 \varphi$ (example assignment function 2),,
and insert -- $\Delta zi = \Delta z_{LM} * (1/\beta_x + (1/\beta_y - 1/\beta_x) * \sin^2 \varphi)^2$
(= example assignment function 2) --

Signed and Sealed this
Twenty-fifth Day of December, 2018

Andrei Iancu
*Director of the United States Patent and Trademark Office*